(12) United States Patent
Sills

(10) Patent No.: US 10,910,255 B2
(45) Date of Patent: Feb. 2, 2021

(54) ARRAYS OF CROSS-POINT MEMORY STRUCTURES

(71) Applicant: Micron Technology, Inc., Boise, ID (US)

(72) Inventor: Scott E. Sills, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/789,368

(22) Filed: Feb. 12, 2020

(65) Prior Publication Data

US 2020/0185265 A1    Jun. 11, 2020

Related U.S. Application Data

(62) Division of application No. 16/179,156, filed on Nov. 2, 2018, now Pat. No. 10,593,589, which is a division
(Continued)

(51) Int. Cl.
*H01L 27/24* (2006.01)
*H01L 21/762* (2006.01)
(Continued)

(52) U.S. Cl.
CPC ......... *H01L 21/76224* (2013.01); *G11C 8/12* (2013.01); *H01L 21/8239* (2013.01); *H01L 27/101* (2013.01); *H01L 27/11502* (2013.01); *H01L 27/11585* (2013.01); *H01L 27/2409* (2013.01); *H01L 27/2463* (2013.01); *G11C 11/221* (2013.01); *G11C 11/2255* (2013.01); *G11C 11/2257* (2013.01); *H01L 27/1021* (2013.01)

(58) Field of Classification Search
CPC .......... H01L 21/76224; H01L 21/8239; H01L 27/101; H01L 27/11502; H01L 27/11585; H01L 27/2463; H01L 45/1233; H01L 45/065; H01L 45/1253; H01L 45/16; H01L 27/409; H01L 27/115–11597; H01L 2924/1451; G11C 8/12; G11C 16/00–349
See application file for complete search history.

(56) References Cited

U.S. PATENT DOCUMENTS 8,021,897 B2    9/2011  Sills et al.
9,576,657 B1 *  2/2017  Saenz ............... G11C 13/0069
(Continued)

*Primary Examiner* — Shahed Ahmed
(74) *Attorney, Agent, or Firm* — Wells St. John P.S.

(57) ABSTRACT

Some embodiments include a memory array having a first set of lines extending along a first direction, and a second set of lines over the first set of lines and extending along a second direction. Lines of the second set cross lines of the first set at cross-point locations. Memory structures are within the cross-point locations. Each memory structure includes a top electrode material, a bottom electrode material and a programmable material. Rails of insulative material extend parallel to the lines of the second set and alternate with the lines of the second set along the first direction. The programmable material has first regions within the memory structures and second regions over the rails of insulative material. A planarized surface extends across the lines of the second set and across the second regions of the programmable material. Some embodiments include methods of forming memory arrays.

18 Claims, 12 Drawing Sheets

Related U.S. Application Data of application No. 15/686,082, filed on Aug. 24, 2017, now Pat. No. 10,153,196.

(51) Int. Cl.
| | |
|---|---|
| *G11C 8/12* | (2006.01) |
| *H01L 27/11502* | (2017.01) |
| *H01L 21/8239* | (2006.01) |
| *H01L 27/10* | (2006.01) |
| *H01L 27/11585* | (2017.01) |
| G11C 11/22 | (2006.01) |
| H01L 27/102 | (2006.01) |

(56) References Cited

U.S. PATENT DOCUMENTS

| | | |
|---|---|---|
| 2009/0230505 A1 | 9/2009 | Dennison |
| 2010/0200830 A1 | 8/2010 | Liu et al. |
| 2010/0259960 A1* | 10/2010 | Samachisa .......... G11C 11/5614 365/51 |
| 2011/0024716 A1* | 2/2011 | Bratkovski ......... H01L 27/2463 257/5 |
| 2012/0164798 A1* | 6/2012 | Sills .................... H01L 45/1608 438/131 |
| 2012/0305872 A1* | 12/2012 | Yoon ....................... H01L 28/90 257/1 |
| 2013/0126816 A1 | 5/2013 | Tang et al. |
| 2013/0168630 A1* | 7/2013 | Ramaswamy ........ H01L 45/146 257/4 |
| 2013/0170283 A1* | 7/2013 | Lan .................... G11C 13/0069 365/148 |
| 2016/0307963 A1 | 10/2016 | Hineman et al. |
| 2017/0025474 A1 | 1/2017 | Sills et al. |
| 2017/0025604 A1* | 1/2017 | Sills ................... H01L 45/1233 |

\* cited by examiner

ARRAYS OF CROSS-POINT MEMORY STRUCTURES

RELATED PATENT DATA

This patent resulted from a divisional of U.S. patent application Ser. No. 16/179,156, filed Nov. 2, 2018, which resulted from a divisional of U.S. patent application Ser. No. 15/686,082, filed Aug. 24, 2017, now U.S. Pat. No. 10,153,196, the disclosures of which are hereby incorporated herein by reference.

TECHNICAL FIELD

Arrays of cross-point memory structures, and methods of forming arrays of cross-point memory structures.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or nonvolatile. Nonvolatile memory cells can store data for extended periods of time including when the computer is turned off. Volatile memory dissipates and therefore is rapidly refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material, and the electrical state of the material may be utilized to represent a memory state. Accordingly, the insulative material of a capacitor may correspond to a programmable material of a memory cell. The insulative materials conventionally utilized in capacitors may dissipate charge quickly, and accordingly tend to be utilized in volatile memory.

One type of capacitor is a ferroelectric capacitor which has ferroelectric material as at least part of the insulating material. Ferroelectric materials are characterized by having two stable polarized states. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a rewrite of the memory cell is conducted to put the memory cell into the pre-read state immediately after its determination. Regardless, a memory cell incorporating a ferroelectric capacitor ideally is nonvolatile due to the bistable characteristics of the ferroelectric material that forms a part of the capacitor. One type of memory cell has a select device electrically coupled in series with a ferroelectric capacitor.

DETAILED DESCRIPTION OF THE ILLUSTRATED EMBODIMENTS

Some embodiments include memory arrays having memory structures at cross-points where wordlines and digit lines overlap. The memory structures may comprise programmable material between upper and lower electrodes. The programmable material may be insulative material, and in some applications may include ferroelectric material. The memory arrays may have planarized surfaces extending across the digit lines and across regions of the programmable material between the digit lines. Some embodiments include methods of forming such memory arrays.

Example embodiments are described with reference to FIGS. 1-12, which show an example process for fabricating an example embodiment memory array; with the example embodiment memory array being shown in FIG. 12 and described with reference thereto.

Figure 1:
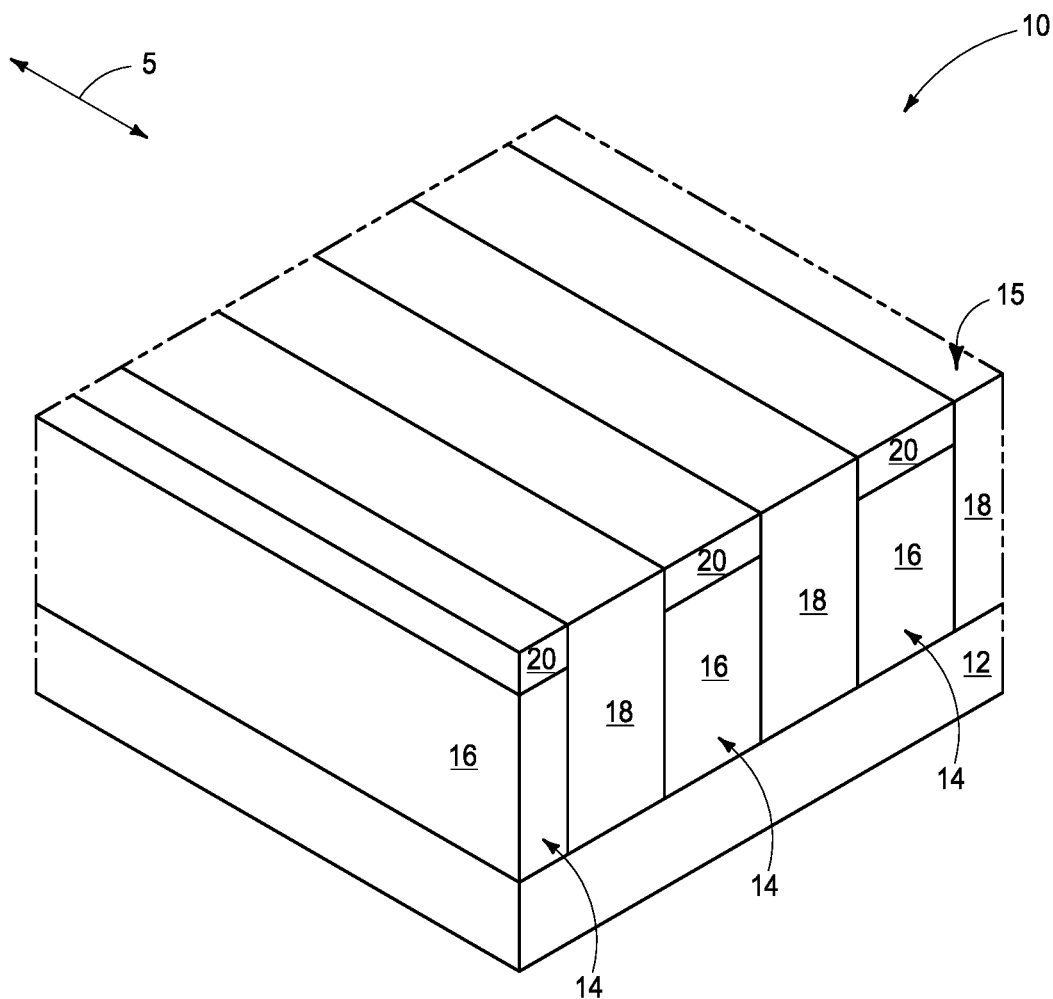
FIGS. 1-12 are diagrammatic three-dimensional views of an example construction at example process stages during fabrication of an example memory array.

Referring initially to FIG. 1, such shows a construction 10 having a plurality of conductive lines 14 extending over a base 12.

The base 12 may comprise insulative material, such as, for example, silicon dioxide. Such insulative material may be supported by a semiconductor material, and may be comprised by semiconductor substrate. The term "semiconductor substrate" means any construction comprising semiconductive material. The term "substrate" refers to any supporting structure, including, but not limited to, a semiconductor substrate.

The conductive lines 14 comprise conductive material 16. The conductive material 16 may include any suitable electrically conductive composition or combination of compositions; such as, for example, one or more of various metals (e.g., titanium, tungsten, cobalt, nickel, platinum, ruthenium, copper, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive lines 14 extend along a first direction corresponding to the direction represented with an axis 5, and are spaced from one another by insulative material 18. The insulative material 18 may comprise any suitable composition or combination of compositions; including, for example, one or more of silicon dioxide, silicon nitride, etc. The insulative material 18 may be the same composition as the insulative material of base 12, or may be a different composition relative to the insulative material of base 12.

Select device material 20 is over the conductive lines 14, and has been patterned with the conductive lines 14. The select device material 20 may comprise any suitable composition or combination of compositions, depending on the particular configuration of select devices which are ultimately to be fabricated. Any suitable existing or yet-to-be-developed select devices may be formed, with example select devices including junction devices, diodes, etc. Example diodes include a PN diodes, PIN diodes, Schottky diodes, Zener diodes, avalanche diodes, tunnel diodes, diodes having more than three materials, threshold switches, ovonic threshold switches (OTS), etc.

Although the select device material 20 is shown to be directly over the conductive lines 14, and to be patterned with such conductive lines, in other embodiments the select devices may be omitted, formed at a later processing stage, spaced from the conductive lines 14 by one or more intervening materials, etc. In the shown embodiment, the entire thickness of the select device material 20 is patterned with the lines 14. In other embodiments, only a portion of the thickness of the stacked device material 20 may be patterned with the lines, depending on the type of select devices being formed.

The conductive lines 14 and select device material 20 may be patterned utilizing any suitable processing, including, for example, pitch-multiplication methodologies (e.g., pitch doubling methodologies).

The construction 10 is shown to have a planarized upper surface 15. Such planarized upper surface may be formed utilizing any suitable processing, including, for example, chemical-mechanical polishing (CMP).

The conductive lines 14 may be referred to as a first set of lines. In some embodiments, such conductive lines may correspond to wordlines.

Figure 2:
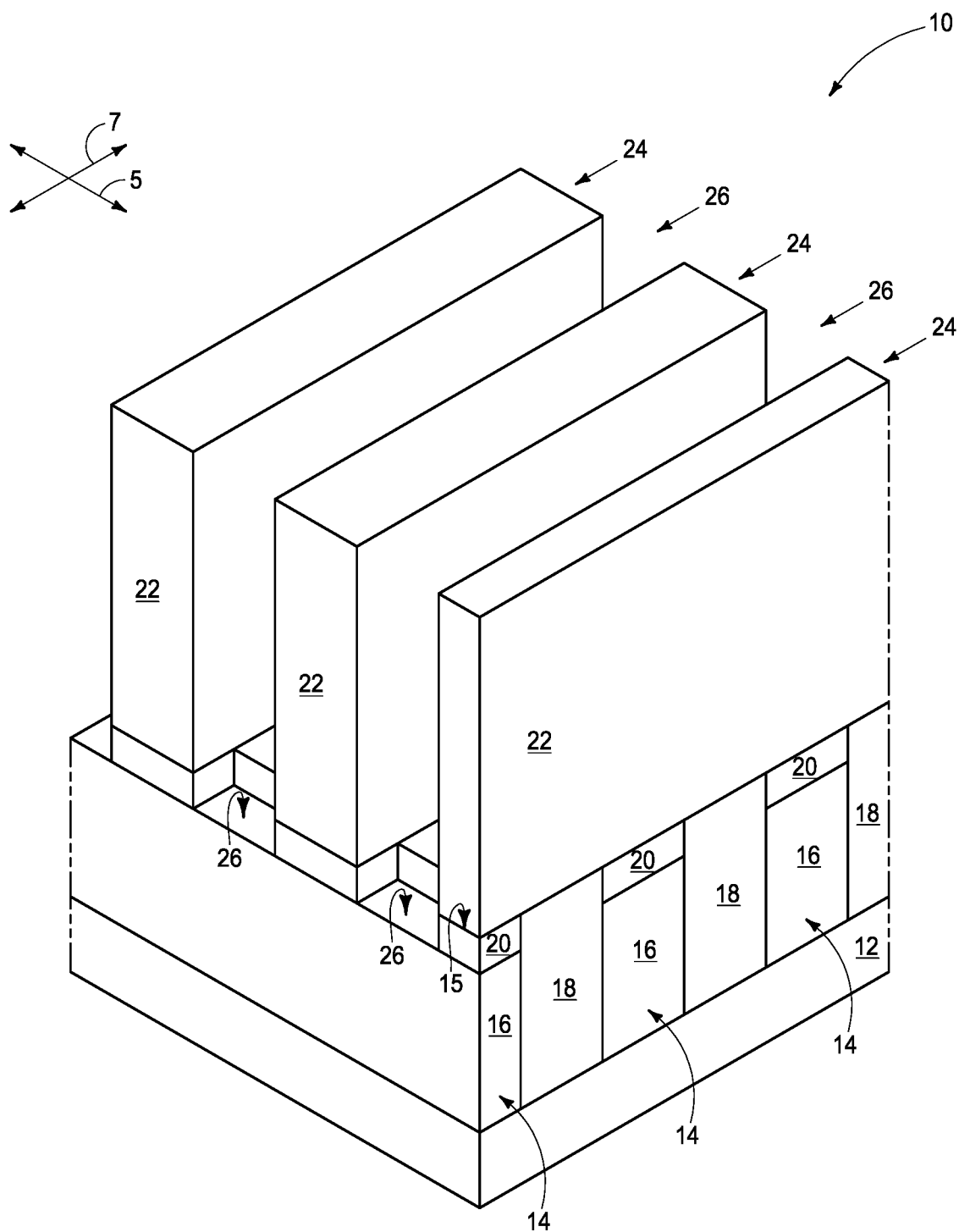

Referring to FIG. 2, dielectric material 22 is formed over the upper surface 15 and patterned into beams 24 extending along a second direction represented with an axis 7. In the illustrated embodiment, the second direction of axis 7 is substantially orthogonal to the first direction of axis 5; with the term "substantially orthogonal" meaning orthogonal to within reasonable tolerances of fabrication and measurement. The beams 24 may be patterned utilizing any suitable processing, including, for example, pitch-multiplication methodologies (e.g., pitch doubling methodologies).

The beams 24 are spaced from one another by intervening gaps 26.

The dielectric material 22 is utilized as a mask to selectively pattern the select device material 20 within gaps 26, and to thereby form openings 26 extending through the select device material 20 to the conductive material 16 of the lines 14.

In some embodiments, the dielectric material 22 may comprise, consist essentially of, or consist of silicon dioxide.

Figure 3:
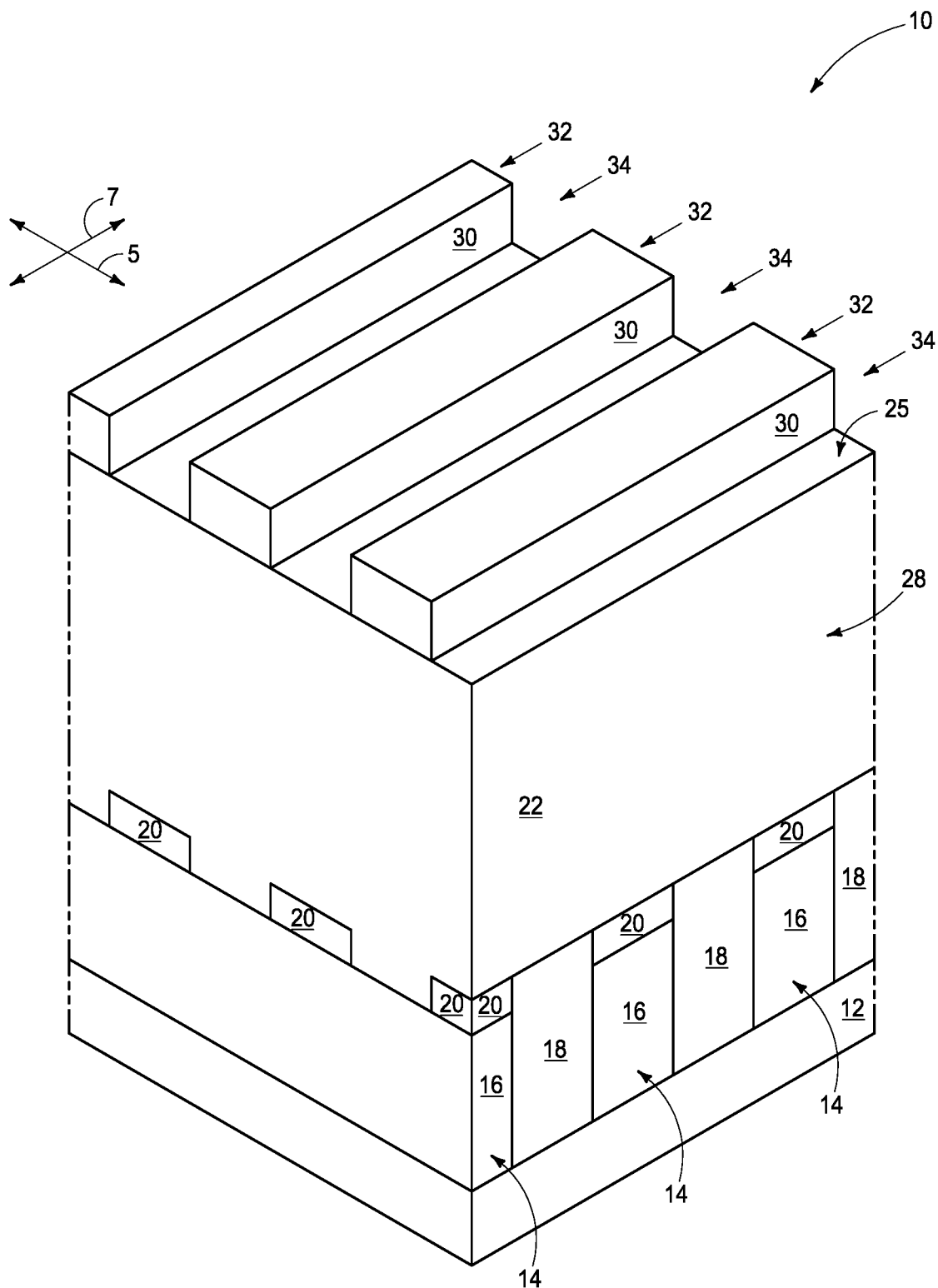

Referring to FIG. 3, the gaps 26 (FIG. 2) are filled with additional dielectric material 22 to form an insulative block 28 of the material 22. The insulative block 28 has an upper surface 25, and patterned masking material 30 is provided over such upper surface.

The patterned masking material 30 may be referred to as hard masking material, and in some embodiments may comprise, consist essentially of, or consist of silicon nitride.

The patterned masking material 30 is configured as a plurality of lines 32 extending along the second direction of axis 7, with such lines being spaced from one another by intervening gaps 34. The material 30 may be patterned utilizing any suitable processing, including, for example, pitch-multiplication methodologies (e.g., pitch doubling methodologies). The lines 32 may be referred to as first masking lines.

The insulative block 28 is utilized as a mask to pattern container openings (as described below), and in some embodiments may be referred to as a block of masking material. Although the block 28 is shown comprising a homogeneous composition, in other embodiments the gaps 26 (FIG. 2) may be filled with a material which differs from the material 22 of beams 24, and accordingly the block 28 may comprise multiple compositions.

Figure 4:
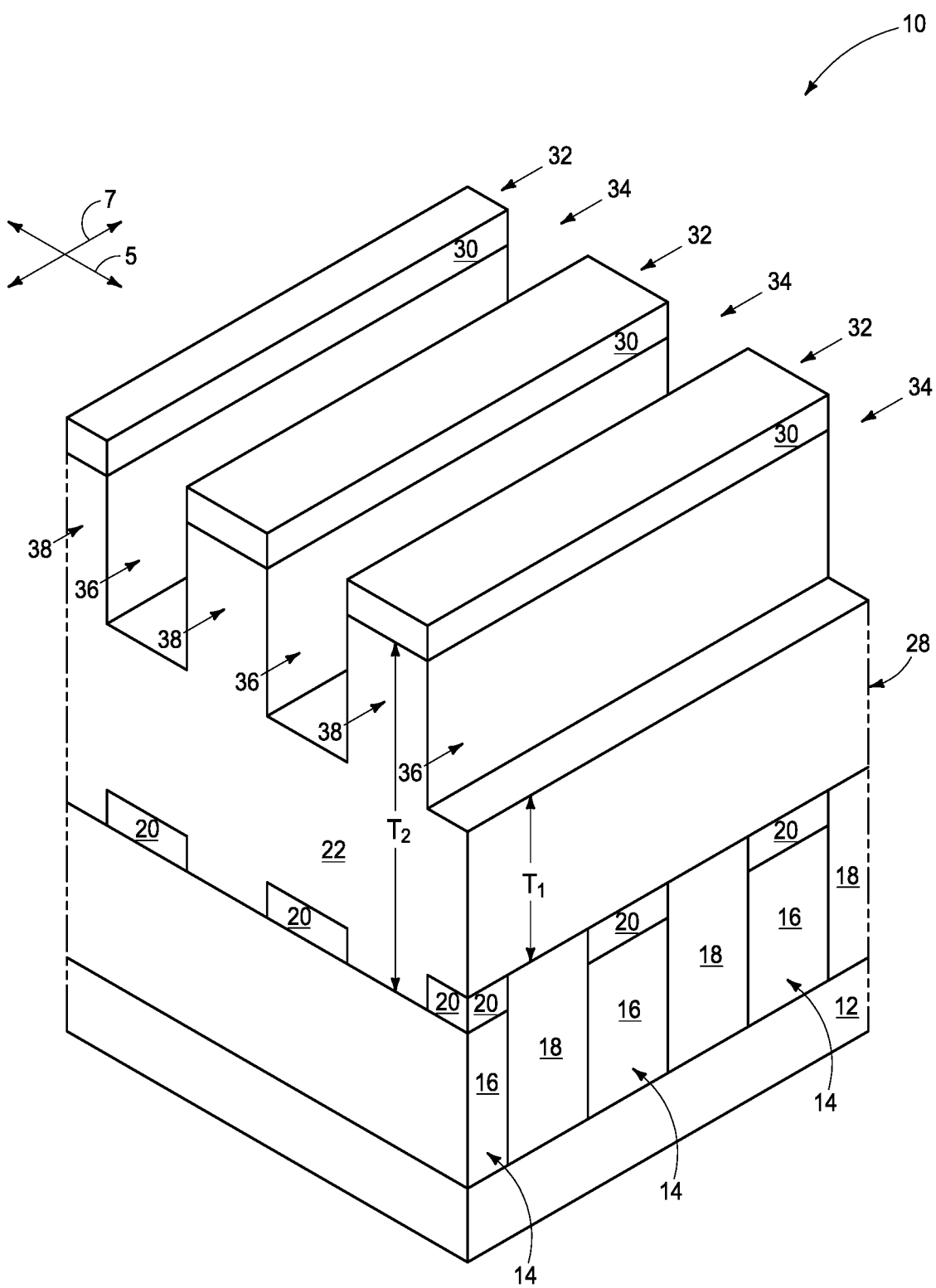

Referring to FIG. 4, a pattern from the patterned masking material 30 is transferred into the block 28 with one or more suitable etches. The patterned block 28 has first regions 36 which are recessed by the etching, and has second regions 38 which are not recessed. The second regions 38 may be referred to as rails. In some embodiments, the recessing of the first regions 36 may be considered to comprise partially etching into the block 28 to form trenches extending along the second direction of axis 7.

The recessed regions 36 have a first vertical thickness $T_1$ and the rails 38 have a second vertical thickness $T_2$. The first vertical thickness $T_1$ may have any suitable relationship to the second vertical thickness $T_2$. In some embodiments, the first vertical thickness $T_1$ may be about on the order of about 1 micron, and corresponds to a memory cell container height. The memory cell containers may be high aspect ratio structures (e.g., aspect ratio of at least about 20:1). A digit line height may correspond to $T_2-T_1$, and may be within a range of from about 500 Å to about 1000 Å. Accordingly, a ratio of $T_1$ to $T_2$ may be within a range of from about 0.85 to about 0.96.

Figure 5:
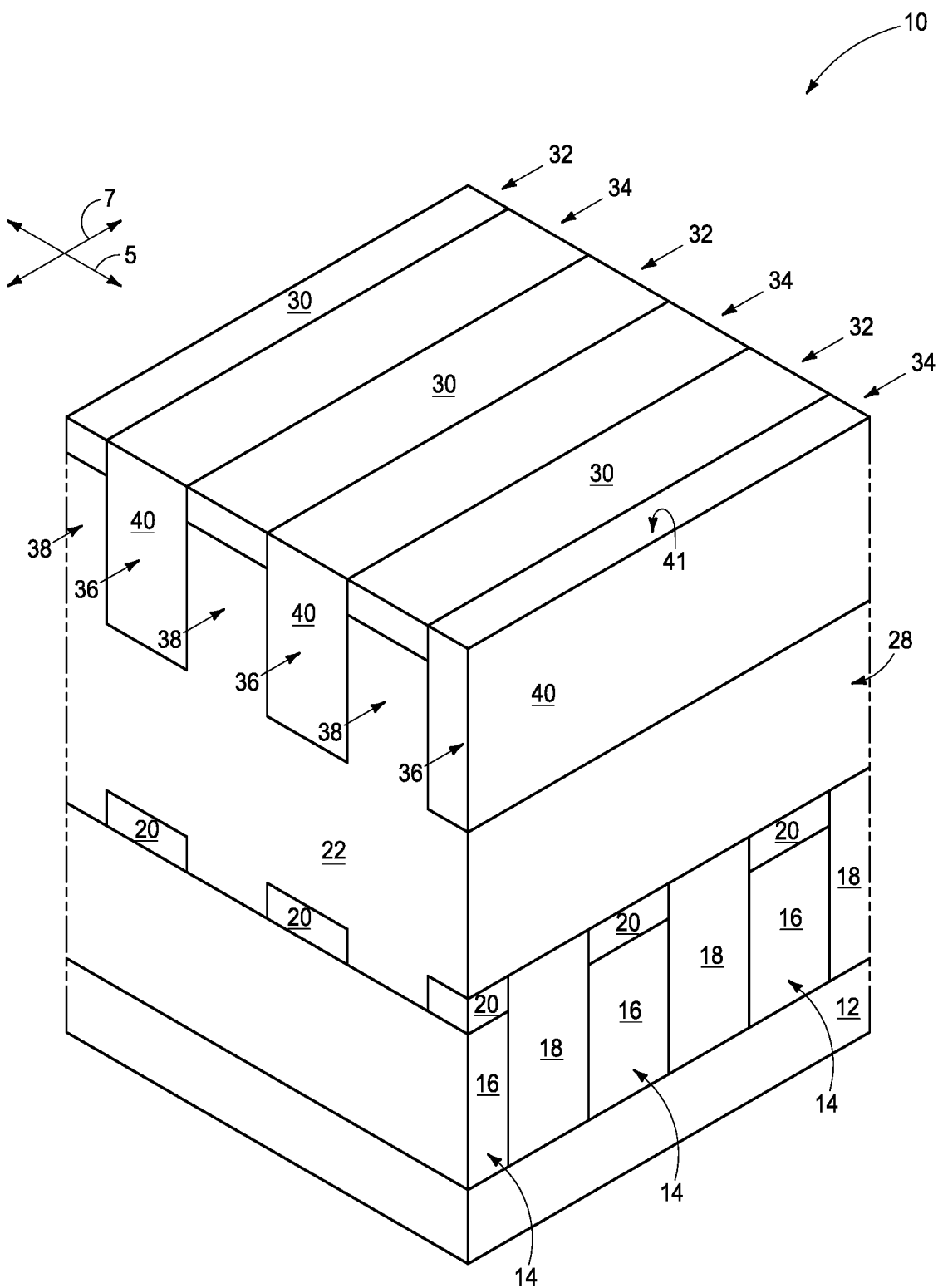

Referring to FIG. 5, sacrificial material 40 is formed within the gaps 34 and over the recessed regions 36 of the dielectric material 22. The sacrificial material 40 may comprise any suitable composition or combination of compositions; and in some embodiments may comprise an organic composition, silicon, etc.

A planarized upper surface 41 formed across the materials 30 and 40 of construction 10. Such planarized upper surface may be formed with any suitable processing, including, for example, CMP.

Figure 6:
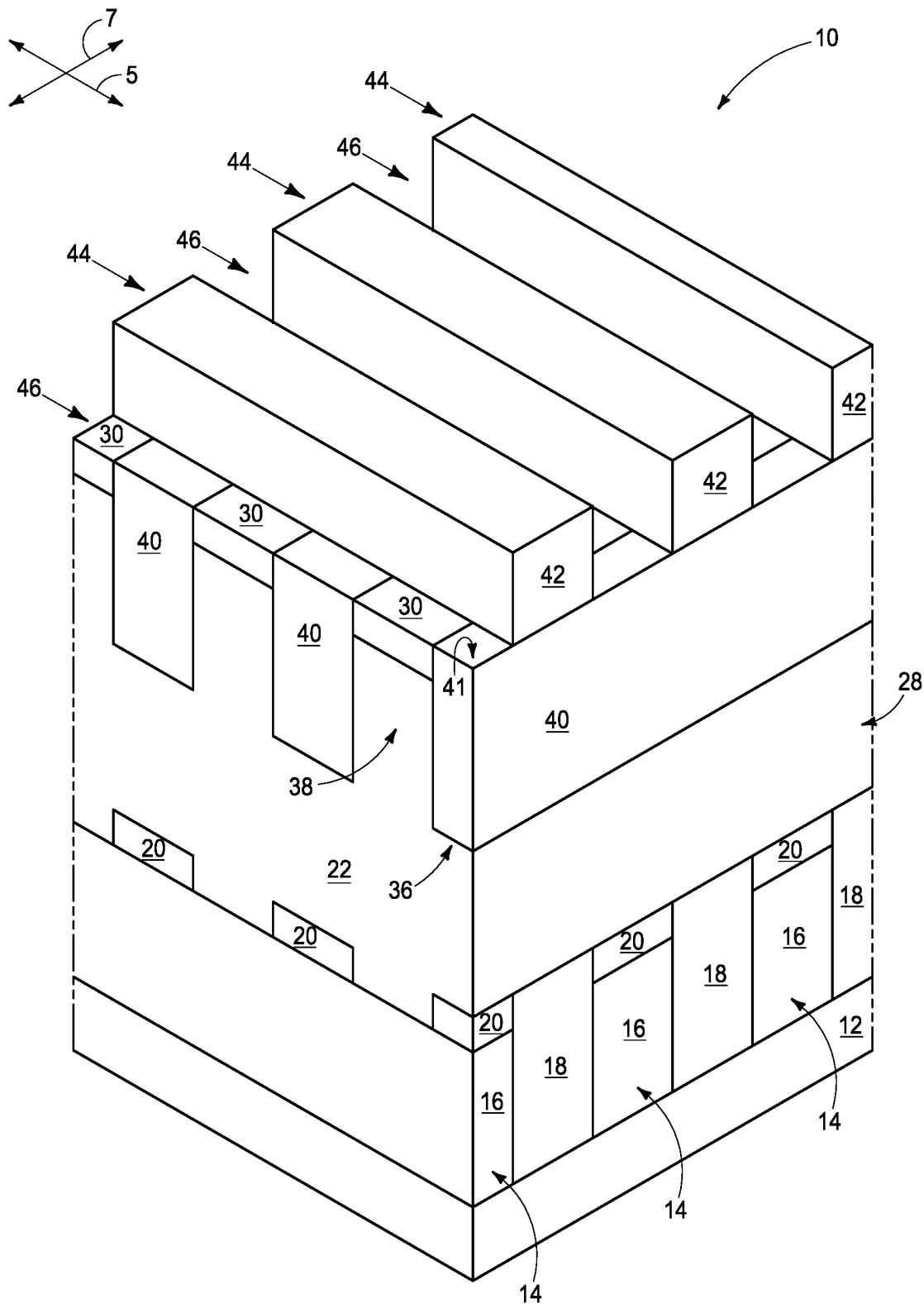

Referring to FIG. 6, patterned masking material 42 is formed on the upper surface 41. The patterned masking material 42 may comprise hard masking material, and may comprise any suitable composition or combination of compositions. In some embodiments, the patterned masking material 42 may comprise, consist essentially of, or consist of silicon nitride. The patterned masking materials 30 and 42 may comprise the same composition as one another in some embodiments; and, for example, may both comprise, consist essentially of, or consist of silicon nitride. Alternatively, the material 42 may comprise a different composition relative to the material 30. The material 42 may be patterned utilizing any suitable processing, including, for example, pitch-multiplication methodologies (e.g., pitch doubling methodologies).

The patterned masking material 42 is configured as linear structures 44 extending along the first direction of axis 5, with such linear structures being spaced from one another by gaps 46. The linear structures 44 may be referred to as second masking lines.

Figure 7:
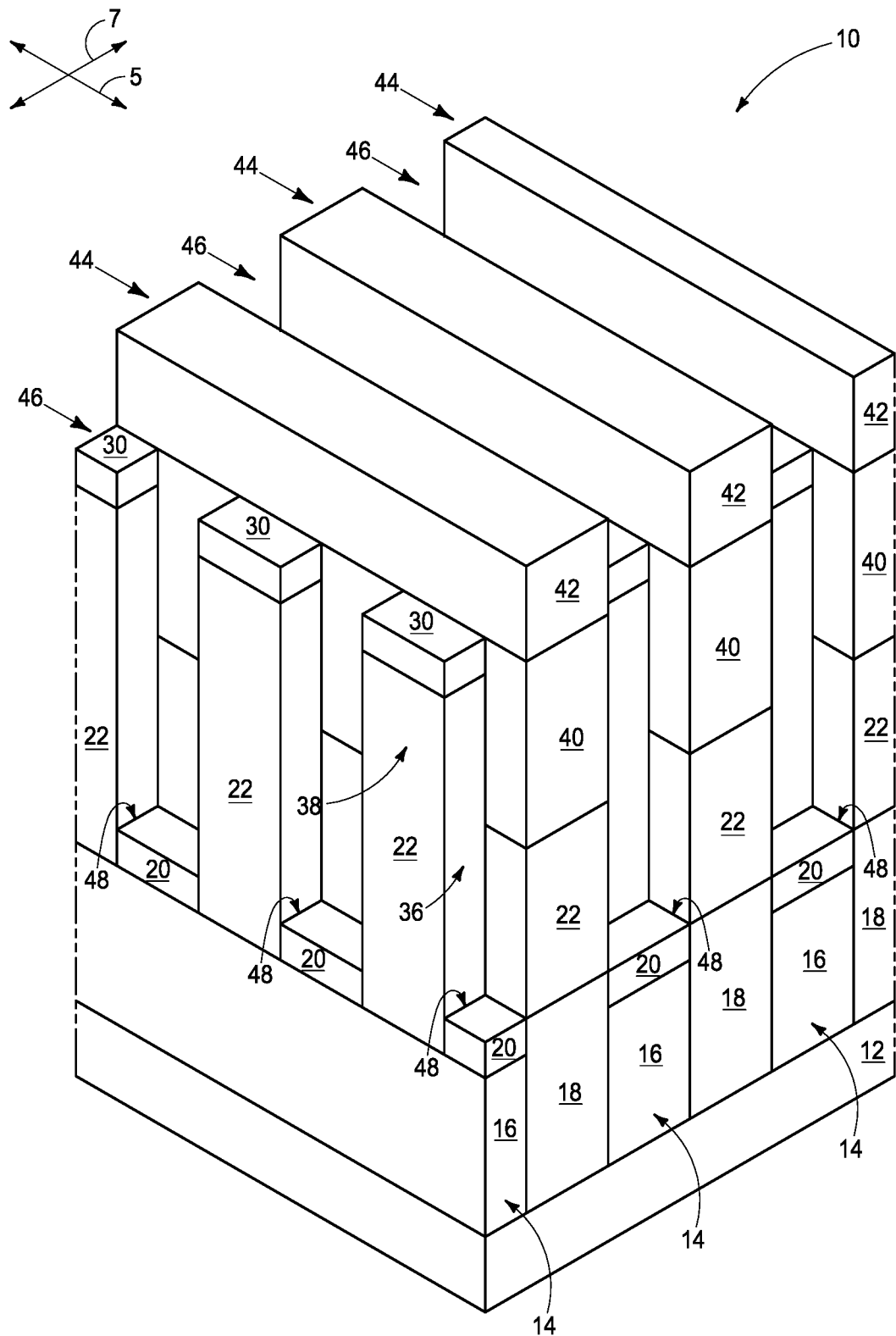

Referring to FIG. 7, patterns from the masking materials 30 and 42 are transferred into the materials 22 and 40 to form openings 48 extending to upper surfaces of the select devices 20. Notably, the material 22 removed at the process stage of FIG. 7 is from the recessed regions 36 described above with reference to FIG. 4.

Figures 8, 8A:
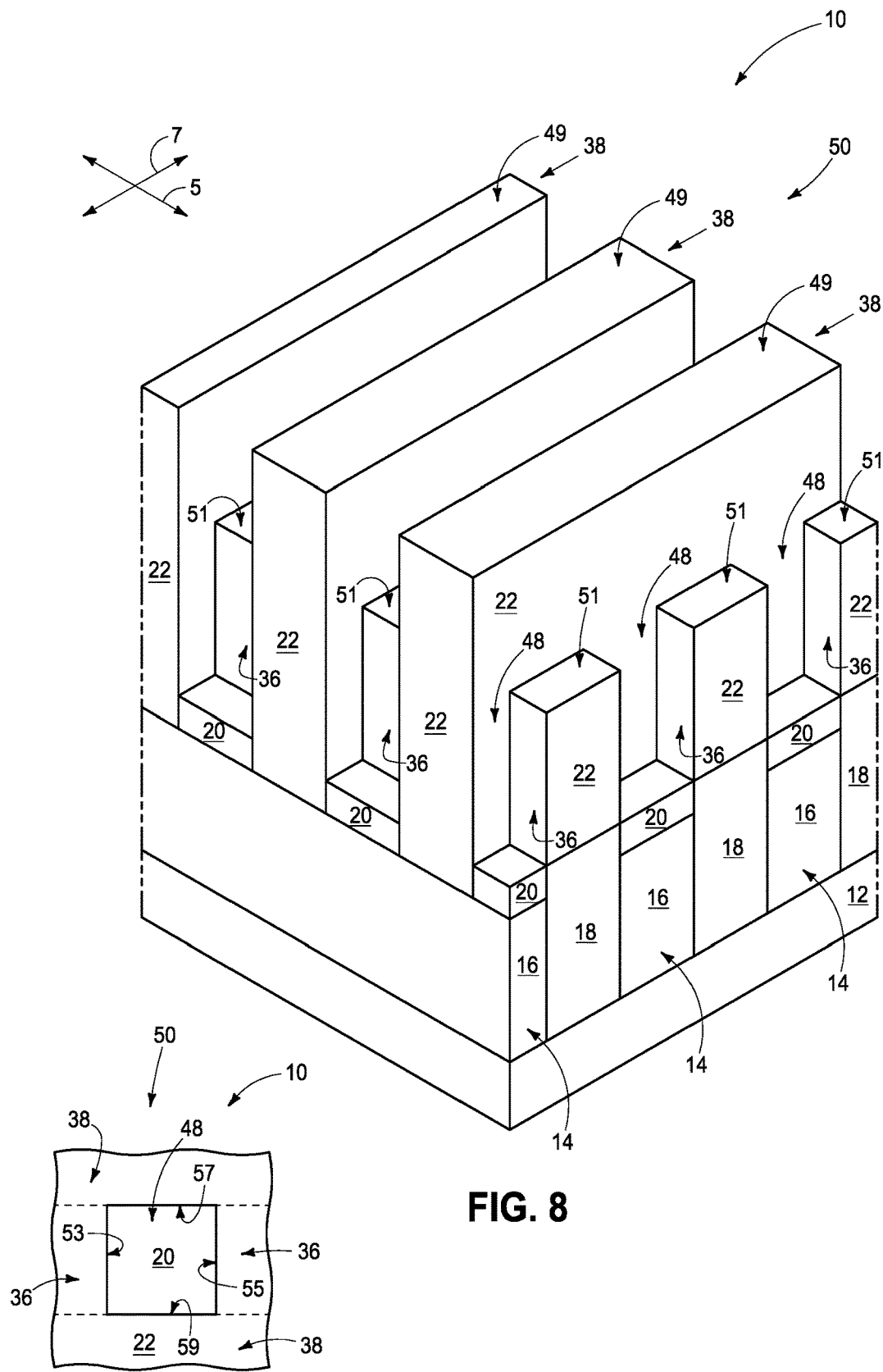
FIG. 8A is a top view of a region of the construction at the processing stage of FIG. 8.

Referring to FIG. 8, the masking materials 30 and 42 (FIG. 7) are removed, together with the sacrificial material 40 (FIG. 7). The material 22 remaining at the processing stage of FIG. 8 has the rails 38, and recessed regions 36 adjacent the rails. In some embodiments, the recessed regions 36 may be referred to as extension structures.

In some embodiments, the material 22 at the processing stage of FIG. 8 may be considered to be configured as a container-patterning mask 50, with such mask having container openings 48 extending therethrough. The container-patterning mask 50 has the rails 38 extending along the second direction of axis 7, and has the extension structures 36 between the rails. The rails 38 may be considered to have first uppermost surfaces 49, and the extension structures 36 may be considered to have second uppermost surfaces 51 which are beneath the first uppermost surfaces.

A region of the container-patterning mask 50 is illustrated in top view in FIG. 8A to illustrate the example configuration of the container openings 48. Specifically, the material 22 surrounds the container opening 48, and the container opening 48 is square-shaped. A first side 53 of the container opening 48 is along one of the extension structures 36, and a second side 55 of the container opening is along another of the extension structures 36. A third side 57 of the container opening 48 is along one of the rails 38, and a fourth side 59 of the container opening is along another of the rails 38. In other embodiments, the container openings 48 may have other shapes.

Figure 9:
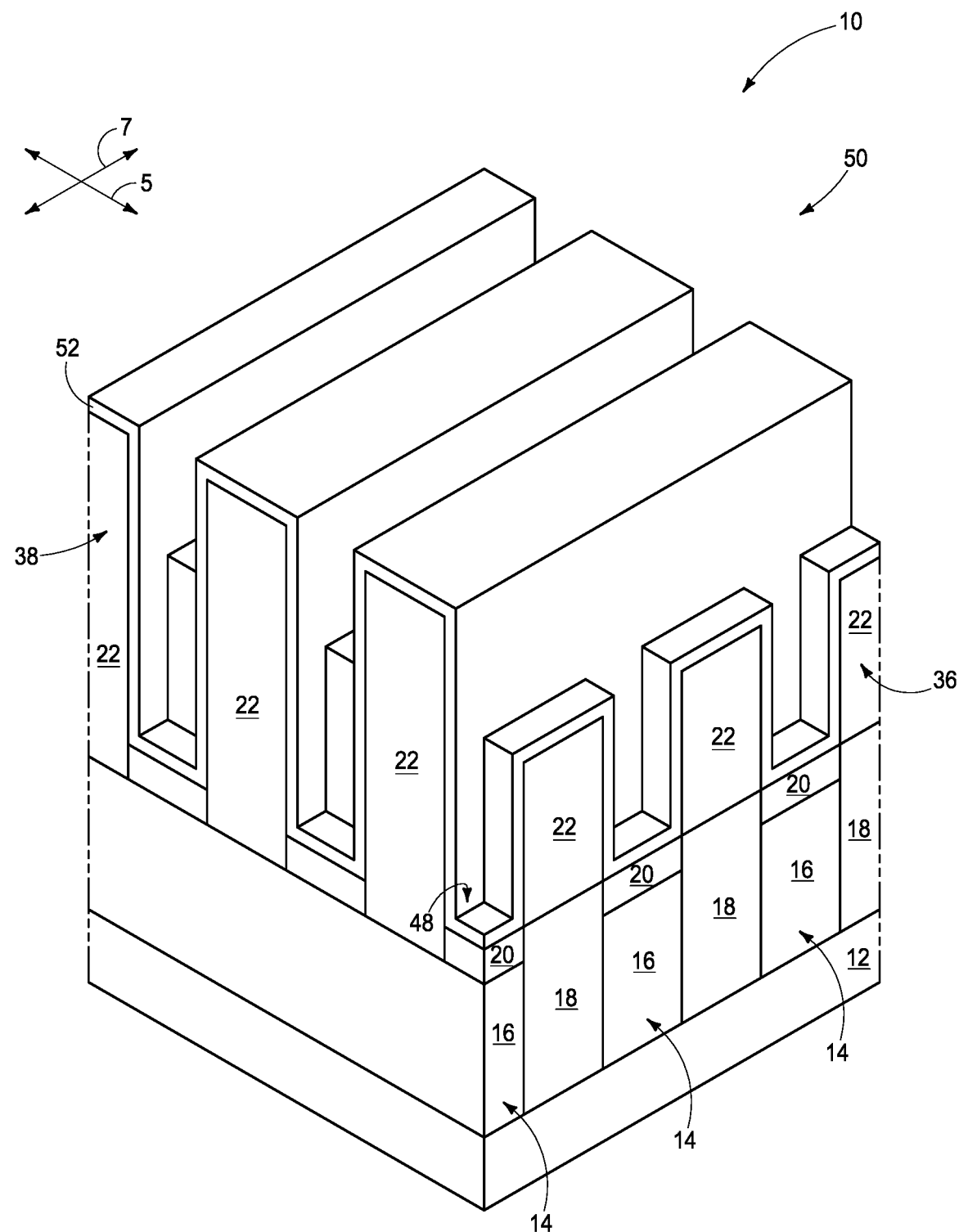

Referring to FIG. 9, electrode material 52 is formed over the container-patterning mask 50 and within the container openings 48. The electrode material 52 may comprise any suitable electrically conductive material(s), such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the electrode material 52 may comprise, consist essentially of, or consist of one or more materials selected from the group consisting of W, WN, TiN, TiCN, TiAlN, TiAlCN, Ti—W, Ru—TiN, TiOCN, RuO, RuTiON, TaN, TaAlN, TaON, TiSiN and TaOCN, etc., where the formulas indicate primary constituents rather than specific stoichiometries. The electrode material may include elemental metals, alloys of two or more elemental metals, conductive metal compounds, and/or any other suitable materials.

In some embodiments, the electrode material 52 may be referred to as a bottom electrode material, or as a first electrode material.

Figure 10:
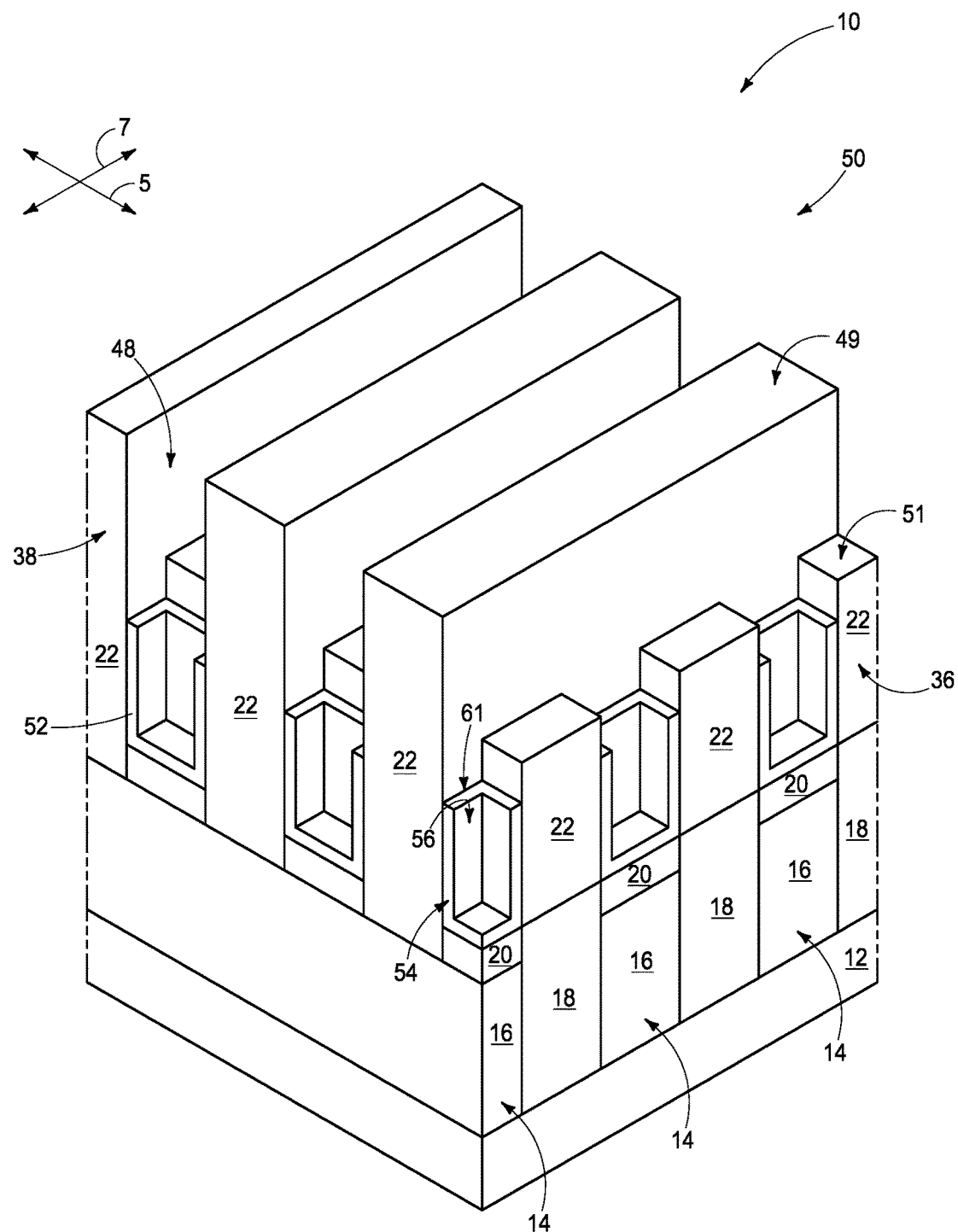

Referring to FIG. 10, the electrode material 52 is patterned into electrode structures 54. The electrode structures 54 have uppermost surfaces 61, which may be referred to as third uppermost surfaces. The third uppermost surfaces 61 are recessed to be lower than the second uppermost surfaces 51 of the extension structures 36, which in turn are lower than the first uppermost surfaces 49 of the rails 38. In some embodiments, the electrode structures 54 may be referred to as bottom electrode structures, or as first electrode structures. The electrode structures 54 are container-shaped, and have upwardly-extending openings 56 therein.

Figure 11:
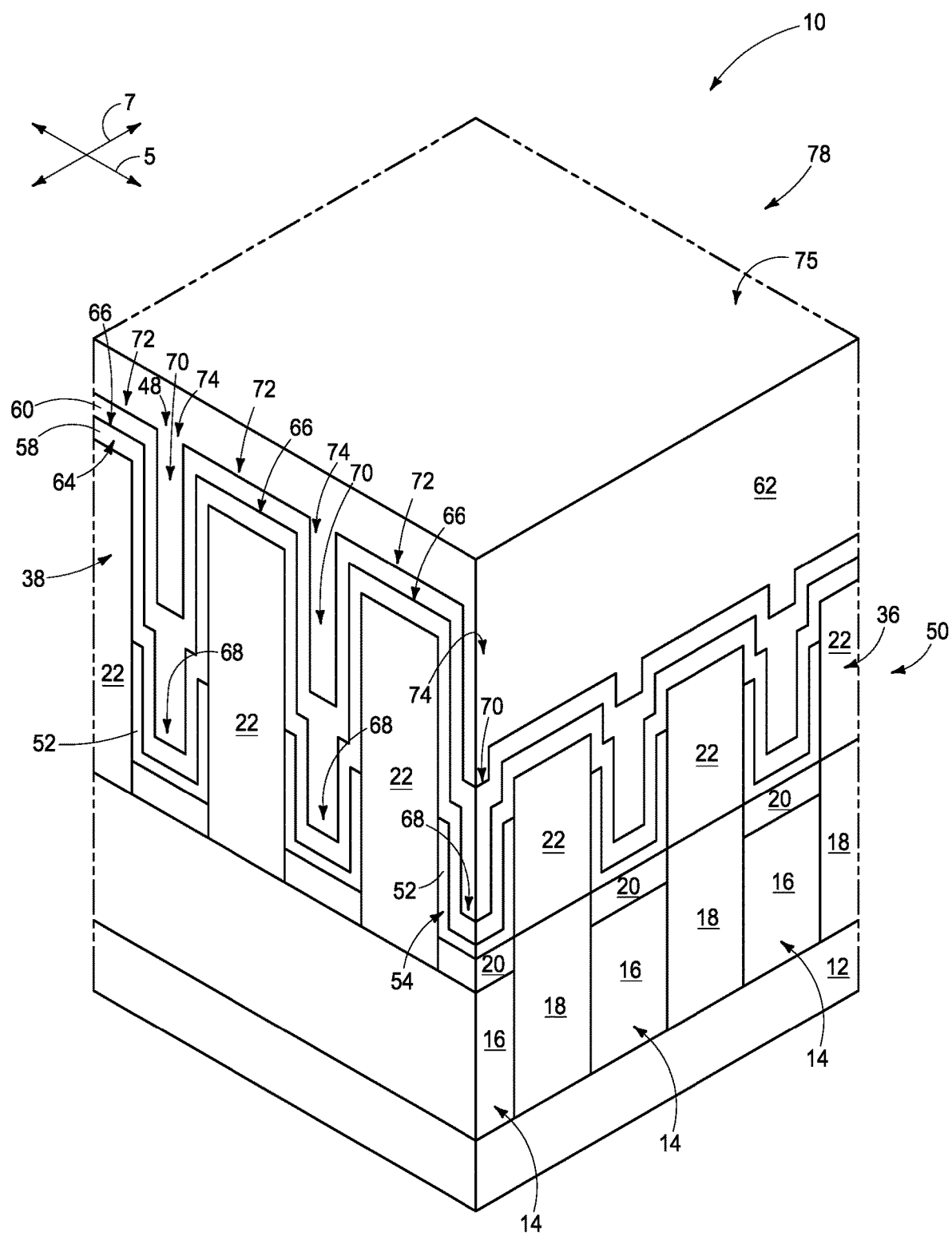

Referring to FIG. 11, programmable material 58 is formed across the container-patterning mask 50 and within the container openings 48, with the programmable material extending into the container-shaped first electrodes 52. Second electrode material 60 is formed over the programmable material 58, and conductive material 62 is formed over the second electrode material 60.

In some embodiments, the programmable material 58 may be considered to be configured as a programmable material structure 64. The programmable material structure 64 has high regions 66 extending over the rails 38, and has trenches (i.e., valleys) 68 between the high regions.

The programmable material 58 may comprise any suitable composition or combination of compositions, and in some embodiments may comprise one or more oxides (for instance, silicon dioxide, hafnium oxide, zirconium oxide, etc.). In some embodiments, the programmable material 58 may include ferroelectric material. The ferroelectric material may be any suitable material. In some embodiments, the ferroelectric material may comprise, consist essentially of, or consist of one or more materials selected from the group consisting of transition metal oxide, zirconium oxide, hafnium oxide, lead zirconium titanate, tantalum oxide, and barium strontium titanate; and having dopant therein which comprises one or more of silicon, aluminum, hafnium, zirconium, lanthanum, yttrium, erbium, calcium, magnesium, niobium, strontium, and a rare earth element.

The second electrode material 60 may be considered to be configured as an expanse provided over the programmable material structure 64. The second electrode material 60 may comprise any suitable composition or combination of compositions, including, for example, any of the compositions described above relative to the first electrode material 52. In some embodiments, the first and second electrode materials may be the same composition as one another, and in other embodiments the first and second electrode materials may be different compositions relative to one another.

The second electrode material 60 has first regions 70 within the trenches 68, and has second regions 72 over the high regions 66 of the programmable material structure 64. The first regions 70 of the electrode material 60 narrow the trenches 68. In some embodiments, the trenches 68 may be considered to be first trenches, and the regions 70 of the second electrode material 60 may be considered to narrow such first trenches and thereby form second trenches 74.

The conductive material 62 is formed over the expanse of the second electrode material 60 and within the trenches 74. In some embodiments, the configuration of FIG. 11 may be considered to be an assembly 78 comprising the illustrated materials and structures, with such assembly having an upper surface 75. The upper surface 75 consists of conductive material 62, and such conductive material extends across the rails 38, across the extension structures 36, and across the container openings 48.

The conductive material 62 may comprise any suitable electrically conductive composition or combination of compositions; such as, for example, one or more of various metals (e.g., titanium, tungsten, cobalt, nickel, platinum, ruthenium, copper, etc.), metal-containing compositions (e.g., metal silicide, metal nitride, metal carbide, etc.), and/or conductively-doped semiconductor materials (e.g., conductively-doped silicon, conductively-doped germanium, etc.).

Figure 12:
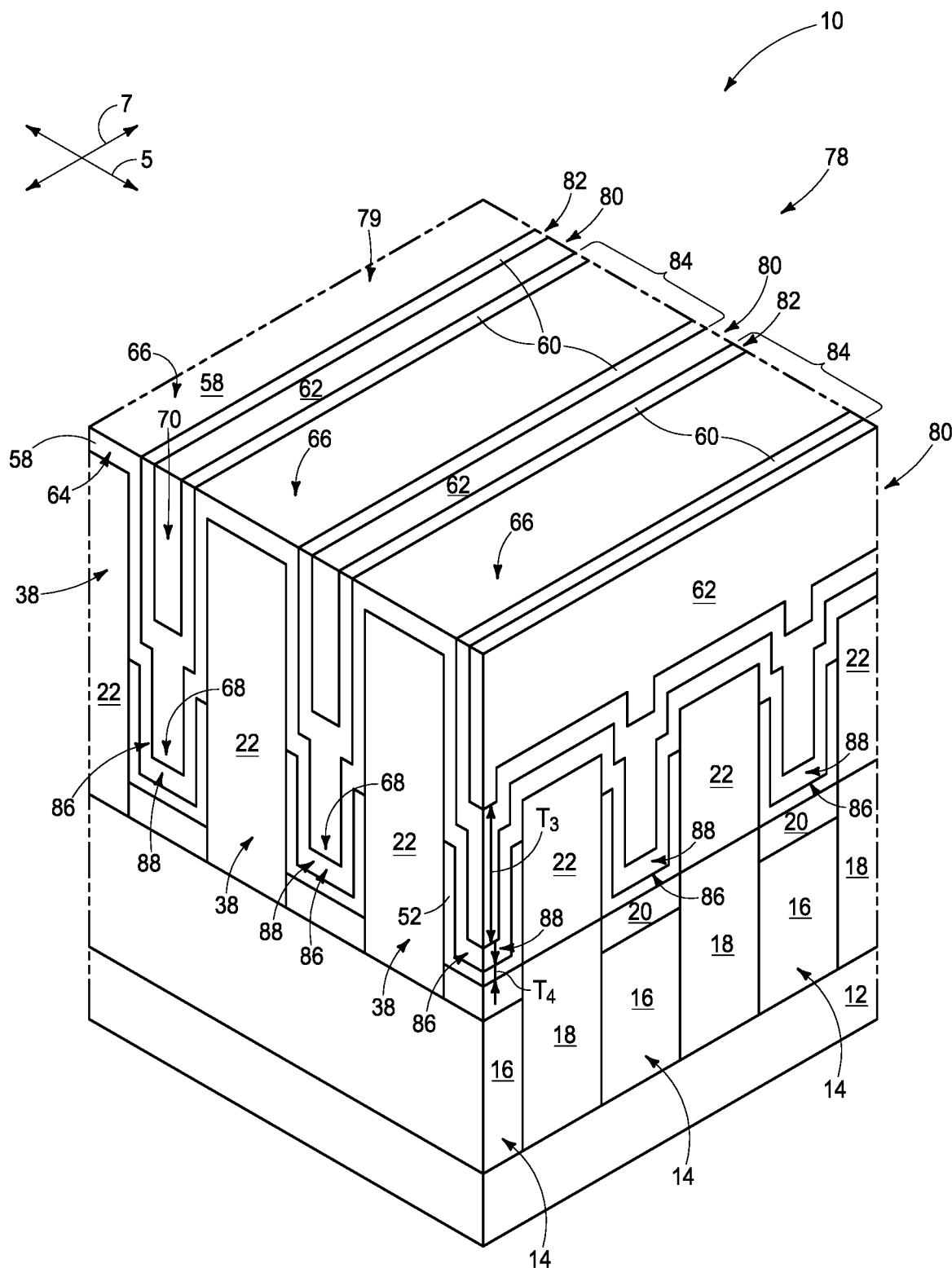

Referring to FIG. 12, an upper surface of the assembly 78 is planarized to remove the conductive material 62 and second electrode material 60 from over the rails 38. The planarization may utilize any suitable processing, including, for example, CMP. After the planarization, the assembly 78 has a planar upper surface 79 which extends across the programmable material 58, the second electrode material 60 and the conductive material 62. The planarization patterns conductive material 62 into lines (e.g., digit lines) 80 extending along the second direction of axis 7, and simultaneously patterns the electrode material 60 into linear structures 82 extending along the second direction of axis 7.

The lines 80 may be considered to be a second set of lines, with the lines 80 of the second set crossing the lines 14 of the first set. In the illustrated embodiment, the lines 80 extend orthogonally relative to the lines 14. In other embodiments, the lines 80 may cross the lines 14 at an angle other than 90°. In some embodiments, the lines 80 of the second set may be considered to be aligned to the rails 38.

The lines 80 may be considered to be spaced from one another by intervening regions 84. The rails 38 of the insulative material 22 are within the intervening regions 84, and extend parallel to the lines 80. The rails 38 alternate with the lines 80 along the first direction of axis 5.

The electrode material 60 may be referred to as a top electrode material. In the illustrated embodiment, the linear structures 82 patterned from the electrode material 60 have upwardly-opening linear trenches 70 therein. The second lines 80 are contained within such upwardly-opening linear trenches 70.

Locations where the second lines 80 cross the first lines 60 may be referred to as cross-point locations 86. Memory structures 88 are within the cross-point locations 86.

The memory structures 88 include a region of the programmable material 58 between the bottom electrode material 52 and the top electrode material 60.

The top electrode material 60 within the memory cells 88 has a first vertical thickness $T_3$, and the bottom electrode material 52 within such memory cells has a second vertical thickness $T_4$. In some embodiments, a ratio of $T_3$ to $T_4$ may be at least about 150.

In some embodiments, the regions 68 of the programmable material 58 may be considered to be first regions within the memory structures 88, and the regions 66 of the programmable material 58 may be considered to be second regions which are over the rails 38. In the illustrated embodiment, the programmable material 58 has an undulating configuration which includes the second regions 66 vertically displaced relative to the first regions 68.

The memory structures 88 may comprise any structures suitable for utilization in a memory array. In some embodiments, the programmable material 58 comprises non-ferroelectric insulative material, and the memory structures 88 are capacitors. In some embodiments, the programmable material 58 comprises ferroelectric material, and the memory structures 88 are ferroelectric capacitors.

The methodology described herein advantageously aligns the upper conductive lines 80 (e.g. digit lines) with memory structures 88 in a damascene-type process utilizing the single masking structure 50 (FIG. 8). In some embodiments, the methodology of FIGS. 1-12 may be considered to form conductive lines 80 which are self-aligned relative to the upper electrodes and other components of the memory structures 88, in that the conductive lines 80 are patterned with the components of the memory structures 88 utilizing a common mask.

In some embodiments, the container-patterning mask 50 may be considered to be formed utilizing first masking lines 32 extending along the first direction and the second masking lines 44 extending along the second direction; and such first and second masking lines may be the only masking lines utilized in fabricating the memory cells 88 and the digit lines 80.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation. Also, the drawings are not drawn to scale, but instead are utilized to generally convey example structures and arrangements of example embodiments. Various features, structures and materials may be much different in dimension (e.g., taller, wider, shorter, thinner, etc.) in relation to other features, structures and materials than is shown in the drawings.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory array having a first set of lines extending along a first direction, and a second set of lines over the first set of lines and extending along a second direction. Individual lines of the second set cross individual lines of the first set at cross-point locations. Memory structures are between the lines of the first and second sets at the cross-point locations. Each memory structure includes a top electrode material, a bottom electrode material and a programmable material between the top and bottom electrode materials. Rails of insulative material extend parallel to the lines of the second set and alternate with the lines of the second set along the first direction. The programmable material has first regions within the memory structures and has second regions over the rails of insulative material. A planarized surface extends across the lines of the second set and across the second regions of the programmable material.

Some embodiments include a memory array having a first set of lines extending along a first direction and a second set of lines over the first set of lines and extending along a second direction substantially orthogonal to the first direction. The lines of the second set cross the lines of the first set at cross-point locations. The lines of the second set are spaced from one another along the first direction by intervening regions. Memory structures are between the lines of the first and second sets at the cross-point locations. Each memory structure comprises a top electrode material, a bottom electrode material and a programmable material between the top and bottom electrode materials. A ratio of a thickness of the top electrode material relative to a thickness of the bottom electrode material along a vertical direction extending through the individual memory structures being at least about 150. Rails of insulative material are within the intervening regions and extend parallel to the lines of the second set. The programmable material has first regions within the memory structures and has second regions within the intervening regions and over the rails of insulative material. The programmable material has an undulating configuration which includes the second regions vertically displaced relative to the first regions. The top electrode material is configured as linear structures extending along the second direction. The linear structures have upwardly-opening linear trenches extending therein. The second lines being are within said upwardly-opening linear trenches.

Some embodiments include a method of forming a memory array. A first set of lines is formed to extend along a first direction. A container-patterning mask is formed over the first set of lines. The container-patterning mask has rails extending along a second direction substantially orthogonal to the first direction and has extension structures between the rails. The rails have first uppermost surfaces and the extension structures have second uppermost surfaces. The second uppermost surfaces are lower than the first uppermost surfaces. The container-patterning mask has container openings extending therethrough, with each of said container openings having a first side along one of the extension structures, a second side along another one of the extension structures, a third side along one of the rails and a fourth side along another one of the rails. First electrode structures are formed within the container openings. The first electrode structures have third uppermost surfaces which are lower than the second uppermost surfaces. The first electrode structures comprise first electrode material. A programmable material structure is formed to have high regions over the rails, and to have first trenches between the high regions. An expanse of second electrode material is formed over the programmable material structure. The expanse of second electrode material has first regions within the trenches and has second regions over the high regions of the programmable material structure. The first regions narrow the first trenches to form second trenches. Conductive material is formed over the expanse of second electrode material and within the second trenches to create an assembly having an upper surface of the conductive material extending across the rails, across the extension structures and across the container openings. The upper surface of the assembly is planarized to remove the conductive material and the second electrode material from over the rails, while leaving the high regions of the programmable material structure over the rails. The planarizing patterns the conductive material into a second set of lines extending along the second direction.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:
1. A memory array, comprising:
memory structures between respective pairs of lines, each pair of lines oriented to establish cross-point locations, the memory structures located in the cross-point locations, each memory structure comprising first and second electrodes;
a programmable material between the first and second electrodes, the programmable material having first regions within the memory structures and having second regions over an insulative material; and
a planarized surface extending across one line of each respective pair of lines and across the second regions of the programmable material.
2. The memory array of claim 1 comprising select devices between one line of each respective pair of lines and the memory structures.
3. The memory array of claim 2 wherein the select devices are diodes.
4. The memory array of claim 1 wherein the memory structures are capacitors.
5. The memory array of claim 1 wherein the memory structures are ferroelectric capacitors.
6. The memory array of claim 1 wherein the insulative material comprises silicon dioxide.
7. The memory array of claim 1 wherein said planarized surface also extends across an upper surface of one of the first and second electrodes.
8. The memory array of claim 1 wherein one line of each respective pair of lines is a wordline, and wherein the other line of each respective pair of lines is a digit line.
9. The memory array of claim 1 wherein the insulative material comprises rail structures.
10. The memory array of claim 9 wherein one line of each respective pair of lines is aligned to extend along a same direction as the rail structures.
11. The memory array of claim 1 wherein the first and second electrodes comprise the same composition.
12. The memory array of claim 1 wherein the first and second electrodes comprise different compositions relative to one another.
13. The memory array of claim 1 wherein one of the first and second electrodes comprises a container-shaped structure.
14. The memory array of claim 13 wherein the programmable material extends into the container-shaped structure, the programmable material comprising another container-shaped structure.
15. The memory array of claim 14 wherein the other of the first and second electrodes fills the container-shaped structure of the programmable material.
16. The memory array of claim 13 wherein the other of the first and second electrodes comprising another container-shaped structure.
17. The memory array of claim 1 wherein the second regions of the programmable material comprise uppermost portions of the programmable material.

18. The memory array of claim 1 wherein lowermost portions of the programmable material is over and against one of the first and second electrodes.

\* \* \* \* \*